United States Patent [19]

Bueno et al.

[11] Patent Number: 4,701,912
[45] Date of Patent: Oct. 20, 1987

[54] DEVICE FOR TRANSMITTING PACKETS IN AN ASYNCHRONOUS TIME-DIVISION NETWORK, AND METHOD OF ENCODING SILENCES

[75] Inventors: Serge Bueno, Bondoufle; Philippe Bourbon, Meudon la Foret, both of France

[73] Assignee: Alcatel, Paris, France

[21] Appl. No.: 893,744

[22] Filed: Aug. 6, 1986

[30] Foreign Application Priority Data

Aug. 7, 1985 [FR] France ................ 85 12092

[51] Int. Cl.$^4$ ................ H04J 3/24; H04J 3/00
[52] U.S. Cl. ................ 370/94; 370/99
[58] Field of Search ........... 370/60, 94, 99, 110.1, 370/93; 340/825.52, 825.53

[56] References Cited

U.S. PATENT DOCUMENTS

| | | | |
|---|---|---|---|
| 3,962,647 | 6/1976 | Richman | 328/59 |
| 4,350,973 | 9/1982 | Petryke, Jr. | 340/347 |
| 4,355,423 | 10/1982 | Theall | 455/608 |
| 4,417,320 | 11/1983 | Ei | 364/900 |

FOREIGN PATENT DOCUMENTS

| | | |
|---|---|---|
| 0081750 | 6/1983 | European Pat. Off. . |
| 3331205 | 3/1985 | Fed. Rep. of Germany . |
| 2046484 | 11/1980 | United Kingdom . |

OTHER PUBLICATIONS

Electronic Design., vol. 30, No. 16, Aug. 1982, pp. 201–212, L. Sanders, "For Data–Comm Links, Manchester Chip Could be Best".

Primary Examiner—Douglas W. Olms
Assistant Examiner—Frank M. Scutch, III
Attorney, Agent, or Firm—Sughrue, Mion, Zinn, Macpeak & Seas

[57] ABSTRACT

A method of encoding silences during transmission of data packets separated by silences consists in transmitting alternately during each silence two types of empty half-bytes which are mirror images of each other and the first two bits of which do not comprise any median transition and thus do not conform to the Manchester encoding law. According to this method, sending of the last data half-byte of a packet in Manchester code by the transmitter is followed by an empty half-byte yielding a transition with the last bit of the last data half-byte. The transmitter and the receiver may be connected by a single link which then carries the clock signal continuously through the intermediary of the data half-bytes and empty half-bytes. The transmission device comprises a transmitter, a receiver and one or two transmission links. In the transmitter an encoder comprises a read-only memory addressed by the information to be transmitted, this information relating to the packets and the silences, and delivering data half-bytes and empty half-bytes. In the receiver a decoder is addressed by the data half-bytes and the empty half-bytes and delivers the corresponding information. The transmitter also comprises a clock and a differential transmitter. The receiver also comprises a differential receiver and:
in the case of two links, a circuit for choosing the phase of the clock signal,
in the case of a single link, a circuit for reconstituting the clock signal. The receiver also comprises a circuit for detecting loss of the clock signal.

10 Claims, 19 Drawing Figures

FIG. 8

|   | ADB (H2 PAR DOM ENV bit3 bit2 bit1 bit0) | ADH | DM |
|---|---|---|---|
| I | 0 X X 1 0 0 0 0 | 10.30.50.70 | 55 |
|   | 0 X X 1 0 0 0 1 | 11.31.51.71 | 56 |
|   | 0 X X 1 0 0 1 0 | 12.32.52.72 | 59 |
|   | 0 X X 1 0 0 1 1 | 13.33.53.73 | 5A |
|   | 0 X X 1 0 1 0 0 | 14.34.54.74 | 65 |
|   | 0 X X 1 0 1 0 1 | 15.35.55.75 | 66 |
|   | 0 X X 1 0 1 1 0 | 16.36.56.76 | 69 |
|   | 0 X X 1 0 1 1 1 | 17.37.57.77 | 6A |
|   | 0 X X 1 1 0 0 0 | 18.38.58.78 | 95 |
|   | 0 X X 1 1 0 0 1 | 19.39.59.79 | 96 |
|   | 0 X X 1 1 0 1 0 | 1A.3A.5A.7A | 99 |
|   | 0 X X 1 1 0 1 1 | 1B.3B.5B.7B | 9A |
|   | 0 X X 1 1 1 0 0 | 1C.3C.5C.7C | A5 |
|   | 0 X X 1 1 1 0 1 | 1D.3D.5D.7D | A6 |
|   | 0 X X 1 1 1 1 0 | 1E.3E.5E.7E | A9 |
|   | 0 X X 1 1 1 1 0 | 1F.3F.5F.7F | AA |
| II | 0 X 0 0 X X X X | 00/0F-40/4F | C9 |
|   | 0 X 1 0 X X X X | 20/2F-60/6F | 36 |
| III | 1 1 X 1 0 0 0 0 | D0.F0 | 00 |
|   | 1 0 X 1 0 0 0 1 | 91.B1 | 00 |
|   | 1 0 X 1 0 0 1 0 | 92.B2 | 00 |
|   | 1 1 X 1 0 0 1 1 | D3.F3 | 00 |
|   | 1 0 X 1 0 1 0 0 | 94.B4 | 00 |
|   | 1 1 X 1 0 1 0 1 | D5.F5 | 00 |
|   | 1 1 X 1 0 1 1 0 | D6.F6 | 00 |
|   | 1 0 X 1 0 1 1 1 | 97.B7 | 00 |
|   | 1 0 X 1 1 0 0 0 | 98.B8 | 00 |
|   | 1 1 X 1 1 0 0 1 | D9.F9 | 00 |
|   | 1 1 X 1 1 0 1 0 | DA.FA | 00 |
|   | 1 0 X 1 1 0 1 1 | 9B.BB | 00 |
|   | 1 1 X 1 1 1 0 0 | DC.FC | 00 |
|   | 1 0 X 1 1 1 0 1 | 9D.BD | 00 |
|   | 1 0 X 1 1 1 1 0 | 9E.BE | 00 |
|   | 1 1 X 1 1 1 1 1 | DF.FF | 00 |

FIG. 9

| | ADB | ADH | DM |
|---|---|---|---|
| | H2 PAR DOM ENV bit3 bit2 bit1 bit0 | | |
| IV | 1 0 X 1 0 0 0 0 | 90.B0 | 01 |
| | 1 1 X 1 0 0 0 1 | D1.F1 | 01 |
| | 1 1 X 1 0 0 1 0 | D2.F2 | 01 |
| | 1 0 X 1 0 0 1 1 | 93.B3 | 01 |
| | 1 1 X 1 0 1 0 0 | D4.F4 | 01 |
| | 1 0 X 1 0 1 0 1 | 95.B5 | 01 |
| | 1 0 X 1 0 1 1 0 | 96.B6 | 01 |
| | 1 1 X 1 0 1 1 1 | D7.F7 | 01 |
| | 1 1 X 1 1 0 0 0 | D8.F8 | 01 |
| | 1 0 X 1 1 0 0 1 | 99.B9 | 01 |
| | 1 0 X 1 1 0 1 0 | 9A.BA | 01 |
| | 1 1 X 1 1 0 1 1 | DB.FB | 01 |
| | 1 0 X 1 1 1 0 0 | 9C/BC | 01 |
| | 1 1 X 1 1 1 0 1 | DD.FD | 01 |
| | 1 1 X 1 1 1 1 0 | DE.FE | 01 |
| | 1 0 X 1 1 1 1 1 | 9F.BF | 01 |
| V | 1 X X 0 X X X X | 80/8F, A0/AF, C0/CF, E0/EF | 00 |

FIG. 16

| | AH | AB | DB (par, sil̄, sil, t, bit 3, bit 2, bit 1, bit 0) | DH |
|---|---|---|---|---|
| I | 55 | 0 1 0 1 0 1 0 1 | 1 1 0 0 0 0 0 0 | C0 |
| | 56 | 0 1 0 1 0 1 1 0 | 0 1 0 0 0 0 0 1 | 41 |
| | 59 | 0 1 0 1 1 0 0 1 | 0 1 0 0 0 0 1 0 | 42 |
| | 5A | 0 1 0 1 1 0 1 0 | 1 1 0 0 0 0 1 1 | C3 |
| | 65 | 0 1 1 0 0 1 0 1 | 0 1 0 0 0 1 0 0 | 44 |
| | 66 | 0 1 1 0 0 1 1 0 | 1 1 0 0 0 1 0 1 | C5 |
| | 69 | 0 1 1 0 1 0 0 1 | 1 1 0 0 0 1 1 0 | C6 |
| | 6A | 0 1 1 0 1 0 1 0 | 0 1 0 0 0 1 1 1 | 47 |
| | 95 | 1 0 0 1 0 1 0 1 | 0 1 0 0 1 0 0 0 | 48 |
| | 96 | 1 0 0 1 0 1 1 0 | 1 1 0 0 1 0 0 1 | C9 |
| | 99 | 1 0 0 1 1 0 0 1 | 1 1 0 0 1 0 1 0 | CA |
| | 9A | 1 0 0 1 1 0 1 0 | 0 1 0 0 1 0 1 1 | 4B |
| | A5 | 1 0 1 0 0 1 0 1 | 1 1 0 0 1 1 0 0 | CC |
| | A6 | 1 0 1 0 0 1 1 0 | 0 1 0 0 1 1 0 1 | 4D |
| | A9 | 1 0 1 0 1 0 0 1 | 0 1 0 0 1 1 1 0 | 4E |
| | AA | 1 0 1 0 1 0 1 0 | 1 1 0 0 1 1 1 1 | CF |
| | 36 | 0 0 1 1 0 1 1 0 | 0 0 1 0 0 0 0 0 | 20 |
| | C9 | 1 1 0 0 1 0 0 1 | 0 0 1 0 0 0 0 0 | 20 |
| II | Y | X | 0 1 0 1 0 0 0 0 | 50 |

DEVICE FOR TRANSMITTING PACKETS IN AN ASYNCHRONOUS TIME-DIVISION NETWORK, AND METHOD OF ENCODING SILENCES

BACKGROUND OF THE INVENTION

1. Field of the Invention

The invention concerns the transmission of packets in an asynchronous time-division network.

2. Description of the Prior Art

In order to be conveyed, any information has to be encoded, meaning changed to symbolic form; the meaning of the symbols is fundamental but is merely a matter for agreement between a sender and a receiver. This encoding concept is complemented by another factor, the transmission mode. Packet mode transmission is a digital transmission mode in which digital data to be transmitted is grouped into packets and associated within each packet with routing and error recovery information, the duration between packets being variable and unambiguously identifiable, this duration corresponding to a silence.

When transmitting packets it is necessary to delimit the packets and silences precisely at the receiving end and also to acquire the received data at the receiving end, the data arriving at a rate set by the remote clock and being acquired at this rate.

An object of the invention is precise delimitation of the packets and silences.

Another object of the invention is simple acquisition at the receiving end of the received data permitting integration of the device carrying out such acquisition.

SUMMARY OF THE INVENTION

In one aspect, the invention consists in a method of encoding silences separating packets in a packet transmission system in which each packet comprises half-bytes of data delivered by a Manchester code transmitter and addressed to a receiver, characterized in that the transmitter delivers, during the silences and alternatively, two types of empty half-byte which are mirror images of each other and each comprise four bits of alternating values, and in that only the third and fourth bits of each empty half-byte comprise a median transition according to the Manchester code, an empty half-byte of a first type having a first bit of level 0, a second bit of level 1, a third bit of value 0 and a fourth bit of value 1, an empty half-byte of a second type having a first bit of level 1, a second bit of level 0, a third bit of value 1 and a fourth bit of value 0.

The transmitter preferably delivers, after a first half-byte of data of a packet, an empty half-byte giving a transition with said last data half-byte, said empty half-byte being of the first type when the last data half-byte ends with a bit of value 0 and of the second type when the last data half-byte ends with a bit of value 1.

In another aspect the invention consists in a device for transmitting packets in an asynchronous time-division network, each silence separating two packets being encoded according to the aforementioned method, the device comprising a transmitter and a receiver connected by a data link carrying data half-bytes in Manchester code of which each bit consists of two half-bits of different value and empty half-bytes, the transmitter comprises a clock, an encoder and a differential transmitter circuit with its output connected to the data link, the clock delivering a first clock signal, a second clock signal obtained by dividing down by eight the first clock signal, and a load signal at the beginning of each first half-period of the second clock signal, the encoder comprises a read-only memory, a register of the parallel-serial type driven by the first clock signal and receiving on a loading input the load signal, said register having a serial output connected to the differential transmitter circuit, a bistable driven by the second clock signal, the read-only memory has its input connected to an information link delivering in parallel four bits in NRZ code constituting an information half-byte, said four bits all having the value 0 during the silences, to a parity link delivering a parity bit for each information half-byte, to an envelope link delivering a signal of value 1 throughout the duration of a packet, to the clock from which it receives the second clock signal, and to the output of the bistable, the read-only memory has eight parallel outputs connected to the parallel inputs of the register, the first output of the read-only memory being also connected to an input of the bistable, the read-only memory delivering a data half-byte in Manchester code for each information half-byte received and empty half-bytes during silences, the first output of the read-only memory delivering a bit whose value corresponds to the level of the last half-bit of the half-byte delivered, the bistable memorizes said bit delivered by said first output of the read-only memory and delivers a signal reflecting the state of the last half-bit of the half-byte, in that the four bits of an information half-byte, the parity bit, the envelope signal, the second clock signal and the signal reflecting the state of the last half-bit constitute a read-only memory address, the read-only memory delivers during a first half-period of the second clock signal eight bits corresponding to a data half-byte when the envelope signal has the value 1, to a first empty half-byte when the envelope signal has the value 0 and the signal reflecting the state of the last half-bit has the value 1, and a second empty half-byte when the envelope signal has the value 0 and the signal reflecting the state of the last half-bit has the value 0.

In a further aspect the invention consists in a device for transmitting packets in an asynchronous time-division network in which the receiver comprises a decoder comprising a serial-parallel type input register, a read-only memory, a parallel-parallel type output register, a counter, first, second and third NOR gates and an exclusive-OR gate, the input register and the counter each have a clock input connected to the input of the decoder, the input register has a data input connected to the data line and eight parallel outputs connected to eight parallel inputs of the read-only memory for addressing said read-only memory, the read-only memory has eight parallel outputs, first, second, third and fourth outputs each delivering one information bit of an information half-byte and being connected to first, second, third and fourth parallel inputs of the output register, a fifth output delivering an error signal connected to a fifth input of the output register, a sixth output delivering a silence signal connected to an input of each of the first and third NOR gates, a seventh output delivering a complemented silence signal connected to a loading input of the counter, and an eighth output delivering a parity signal and connected to a seventh input of the output register, the output register has eight outputs each corresponding to one input of said output register, the first, second, third and fourth outputs of the output register delivering the four bits of the information half-byte and being connected to the data output link, the fifth output being connected to the error output link, the sixth output being connected to the envelope output link, the seventh output being connected to the parity output link, the eighth output being connected to the synchronization link, the first NOR gate has another input connected to the synchronization output link and an output connected to an input of the second NOR gate another input of which is connected to the error output link, the second NOR gate having an output connected to an input of the exclusive-OR gate and to the eighth input of the output register, the exclusive-OR gate has another input held at a positive potential and an output connected to another input of the third NOR gate of which an output is connected to the sixth input of the output register, and the counter has its output connected to a clock input of the output register, said counter delivering a second remote clock signal obtained by dividing by eight the first remote clock signal received by the counter.

The method in accordance with the invention for encoding silences provides an immediate and unambiguous identification of the inter-packet duration, such identification being achieved by modifying the Manchester encoding rule; it permits immediate detection of the inter-packet duration (silences) and thus of the beginning of a packet without any loss of information, since there is no synchronization algorithm (synchronization word) unlike the HDB3 protocol, for example, where information is lost during execution of the synchronization algorithm.

Another advantage of the method in accordance with the invention is that there is no insertion of zeros, unlike the HDLC protocol; thus a packet contains only useful information; also, there are no bit configurations for which transmission is illegal.

The method in accordance with the invention offers the further advantage of making it possible to transmit a clock signal continuously where there is only one line between transmitter and receiver. Thus there is no loss of clock signal between packets, which makes it possible to distinguish a break on the line from an absent packet.

Another advantage of the method in accordance with the invention resides in the fact that the packet delimiter patterns, called empty half-bytes, have a null continuous component, like the data half-bytes of a packet which are in the Manchester code, which makes it possible to transmit packets over large distances. Also, since the information to be transmitted is in the form of information half-bytes, meaning groups of four information bits, verifying the number of bits in a packet provides additional protection against errors. It is also possible to transmit packets of variable size separated by inter-packet durations that are also variable.

The invention will now be described by way of non-limiting example only and with reference to the appended drawings.

BRIEF DESCRIPTION OF THE DRAWINGS

FIGS. 8 and 9 show the content of the memory of the encoder in FIG. 3.

FIG. 16 shows the content of the memory of the decoder in FIG. 14.

DESCRIPTION OF THE PREFERRED EMBODIMENTS

Figure 1:
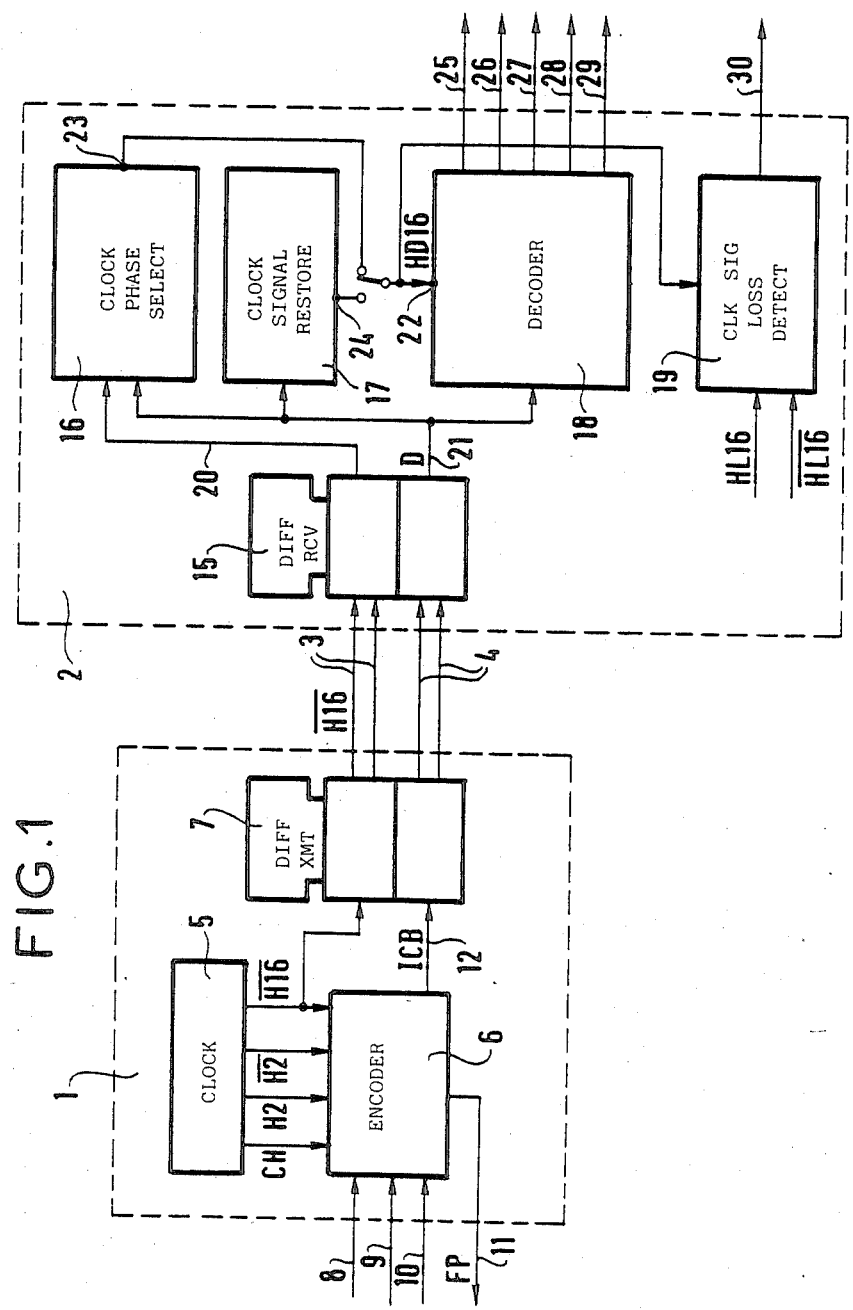
FIG. 1 is a general schematic of a transmission device in accordance with the invention.

FIG. 1 is a schematic representation of a packet transmission device in accordance with the invention comprising the transmitter 1 and a receiver 2 connected by a clock link 3 and a data link 4, both these links being two-wire links.

The clock link 3 is used to transmit the signal which has a frequency of 16 MHz, for example.

The transmitter 1 comprises a clock 5, an encoder 6 and a differential transmitter 7. The encoder 6 receives from the clock a load signal CH, a clock signal $\overline{H16}$ at the frequency of 16 MHz and two other clock signals H2 and $\overline{H2}$ each of which is the complement of the other and has a frequency of 2 MHz.

The encoder has its input connected to a circuit (not shown) which delivers the information to be transmitted; the encoder is connected to this circuit by an information link 8 which is a parallel link on four lines, a parity link 9 and an envelope link 10. The information link 8 delivers half-bytes each consisting of four bits 0, 1, 2, 3 in parallel, the parity link 9 delivers a parity bit relating to the half-byte consisting of bits 0, 1, 2, 3 and the envelope link 10 delivers an envelope signal of value 0 in the absence of any information and of value 1 when information is present.

The information link 8 delivers in parallel to the transmitter four information bits in NRZ (no return to zero) code which constitute an information half-byte. On receipt of each half-byte the emitter will deliver data in Manchester code which will be referred to for convenience as the data half-byte since it corresponds to a received information half-byte and has the same duration as this. Likewise, the silences separating two data packets will be encoded by the transmitter into "half-bytes" referred to as empty half-bytes, these empty half-bytes having the same duration as the data bytes emitted by the transmitter.

The output of the encoder is connected to the circuit delivering information to the transmitter by a parity error link 11 on which it delivers a parity error signal FP.

The input of the differential transmitter 7 is connected to the clock 5 from which it receives the clock signal $\overline{H16}$ and to the output of the encoder 6 by a line 12 over which it receives in serial form the data ICB to be transmitted, this data consisting of data half-bytes and empty half-bytes corresponding to the silences between two packets; the differential transmitter has its output connected to the clock link 3 which transmits the clock signal $\overline{H16}$ and to the data link which transmits the ICB data received from the encoder 6.

The receiver 2 comprises a differential receiver 15, a circuit 15 for choosing the phase of the clock signal, a circuit 17 for reconstituting the clock signal, a decoder 18, and a circuit 19 for detecting loss of the clock signal.

The input of the differential receiver 15 is connected to the clock link 3 and to the data link 4; its output is connected by a clock line 20 to the circuit 16 for choosing the phase of the clock signal; its output is also connected by a data line 21 over which it delivers data D which corresponds to the data ICB delivered by the encoder of the transmitter to the circuit 16 for choosing the phase of the clock signal, to the circuit 17 for reconstituting the clock signal and to the decoder 18.

The decoder 18 has an input 22 connected either to the output 23 of the circuit 16 or to the output 24 of the circuit 17. The transmitter 1 and the receiver 2 may be linked by both clock and data links 3 and 4, in which case the signal 17 for reconstituting the clock signal is superfluous, or by the data link 4 only, which requires the circuit 17 to reconstitute the clock signal, in which case the circuit 16 for choosing the phase of the clock signal is superfluous. In practise those skilled in the art will choose the transmission type used, a data link 4 only or two links, a clock link 3 and a data link 4; once this choice has been made, the receiver will comprise only one of the circuits 16 and 17. The receiver 2 may naturally comprise both circuits 16 and 17, which makes it possible to connect the transmitter 1 and the receiver 2 by a data link 4 only or by two links 3 and 4; the input 22 of the decoder is then connected, by straps for example, either to the output terminal 23 of the circuit 16 or to the output terminal 24 of the circuit 17, according to the type of transmission between transmitter and receiver chosen. The input 22 of the decoder receives a remote clock signal HD16 either from the circuit 16 or from the circuit 17.

The output of the decoder 18 is connected to a data output link 25 which delivers the four data bits in parallel to a parity output link 26, to an envelope output link 27, to an error output link 28 and to a synchronization output link 29.

The circuit 19 for detecting loss of the clock signal is connected to the input 22 of the decoder 18 and receives the remote clock signal HD16; the circuit 19 also receives local clock signals HL16 and $\overline{HL16}$ from a local clock (not shown) with a frequency of 16 MHz.

The input of circuit 19 is connected to a clock loss output link 30.

Figure 4:
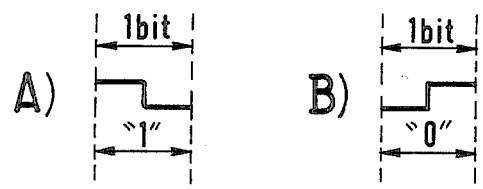
FIG. 4 shows at (A) a bit of value "1" and at (B) a bit of value "0" in Manchester code.
Figure 5:
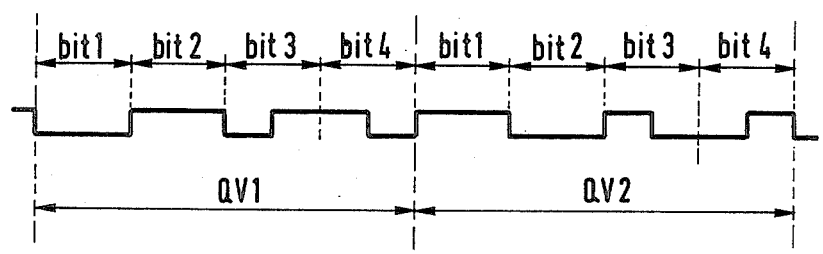
FIG. 5 shows two types of empty half-bytes QV1 and QV2 in accordance with the invention.

As previously stated the transmitter delivers half-bytes in Manchester code. FIG. 4 shows at (A) a bit of value 1 and at (B) a bit of value 0, encoded in this code; each bit thus features a median transition and a bit of value 1 is represented by a level 1 for a duration of $\frac{1}{2}$ bit followed by a level 0 for a duration of $\frac{1}{2}$ bit and a bit of value 0 is represented by a level 0 for a duration of $\frac{1}{2}$ bit followed by a level 1 for a duration of $\frac{1}{2}$ bit. In the absence of any data the invention provides for transmission of empty half-bytes using two alternate empty half-byte configurations QV1 and QV2 as shown in FIG. 5. In each of these two configurations bits 1 and 2 do not comprise any median transition and this special feature makes the empty half-byte configurations QV1 and QV2 virtually inimitable.

Figure 6:
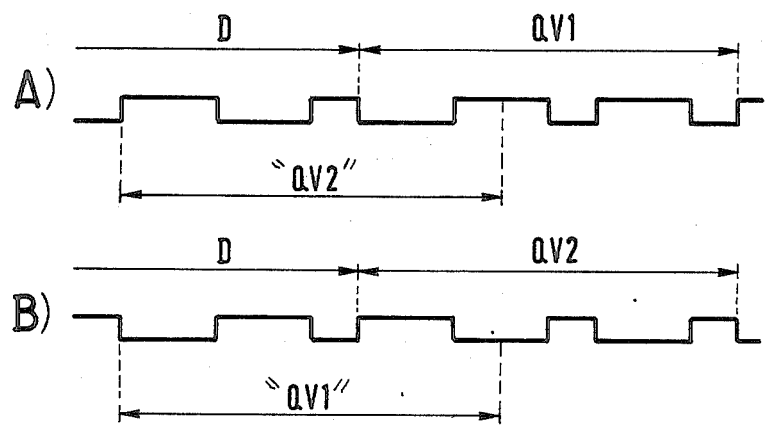
FIG. 6 shows at (A) an imitated empty byte "QV1" and at (B) an imitated empty byte "QV2" during transmission of packets.

A half-byte QV1 with the first configuration consists of a first bit of level 0, a second bit of level 1, a third bit of value 0 and a fourth bit of value 1; an empty half-byte QV2 with the second configuration consists of a first bit of level 1, a second bit of level 0, a third bit of value 1 and a fourth bit of value 0; the third and fourth bits of the empty half-bytes QV1 and QV2 are in Manchester code and therefore feature a median transition. The two empty half-byte configurations QV1 and QV2 (FIG. 5) are used so that at the end of a packet and depending on the value of the last bit in the packet, and thus of the last half-byte in the packet, there is a transition on changing to an empty half-byte. Thus when the last bit of the packet has the value 1 the second type of empty half-byte QV2 is used and when the last bit of the packet has the value 0 the first type of empty half-byte QV1 is used. Given these conditions and subject to the composition of the last half-byte of the packet, meaning according to the values of the four bits of this half-byte, imitation of a QV1 or QV2 empty half-byte my occur. Curve A in FIG. 6 shows imitation of a "QV2" empty half-byte, curve B showing imitation of a "QV1" empty half-byte, and it will be seen that an imitated "QV1" or "QV2" empty half-byte consists of $\frac{1}{2}$ bits of the last data half-byte D and $\frac{1}{2}$ bits of the empty half-byte following this data half-byte. These imitations of an empty half-byte, which do not occur frequently since they are dependent on the last half-byte in a packet, do not prejudice correct functioning of the decoder, as will be explained in more detail later.

These empty half-bytes QV1 and QV2 do not have any continuous component, as is also the case with data half-bytes in Manchester code.

It is possible to have two inimitable empty half-byte configurations, but this is without the advantage of a null continuous component. In the first configuration, derived from the first empty half-byte QV1 shown in FIG. 5, bit 2 is a bit of value 1, with median transition, the other bits being identical; in the second configuration, derived from the empty half-byte QV2 shown in FIG. 5, bit 2 is a bit of value 0 with median transition. These two configurations derived from the empty half-bytes QV1 and QV2 of figure 5 will not be adopted by virtue of their non-null continuous component.

Figure 2:
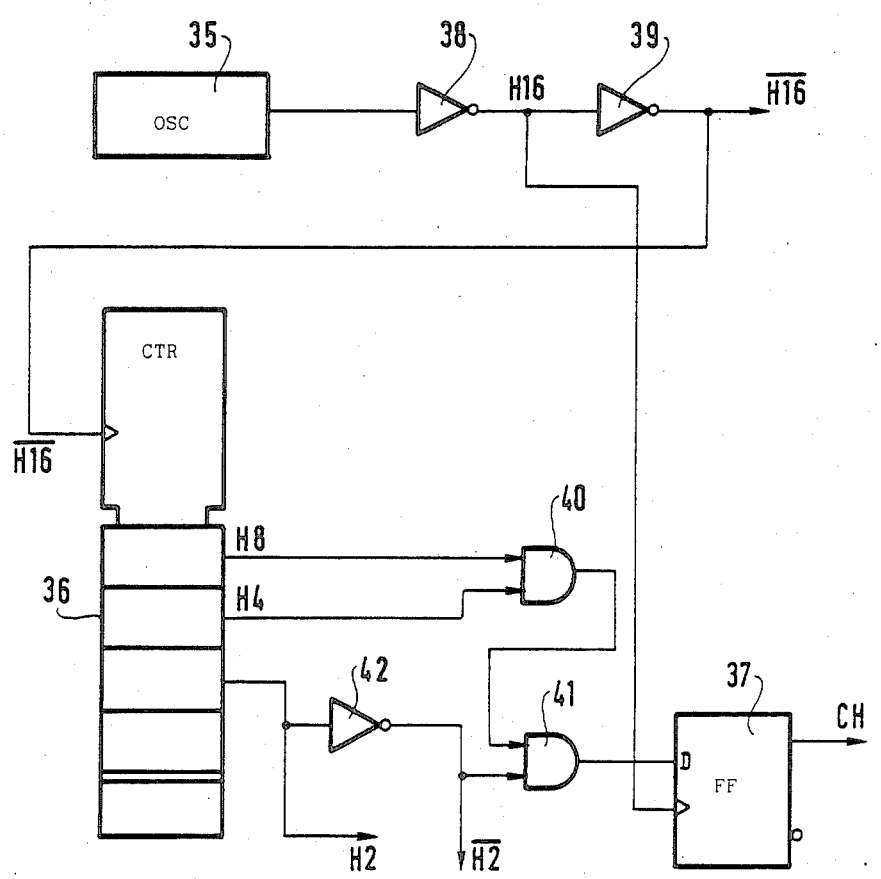
FIG. 2 shows the clock circuit from FIG. 1.

FIG. 2 shows the clock 5 from FIG. 1. The clock essentially comprises an oscillator 35, a counter 36 and a type D flip-flop (bistable) 37.

The oscillator output is connected to an inverter 38 the output of which is connected to a clock input of the flip-flop 37 and to an inverter 39; the output of the inverter 39 is connected to a clock input of the counter and to the encoder from FIG. 1.

The inverter 38 delivers a clock signal H16 and the inverter 39 delivers a clock signal $\overline{H16}$.

The counter 36 delivers on a first output a clock signal H8 of frequency 8 MHz, on a second output a clock signal H4 of frequency 4 MHz and on a third output a clock signal H2 of frequency 2 MHz.

An AND gate 40 has an input connected to the first output of the counter, another input connected to the second output of the counter and an output connected to an input of another AND gate 41 of which another input is connected by an inverter 42 to the third output of the counter. The output of the AND gate 41 is connected to a data input of the flip-flop 37 which delivers at its output the load signal CH addressed to the encoder 6, with the same period as the clock signal H2. The third output of the counter 36 and the output of the inverter 42 respectively deliver the clock signals H2 and $\overline{H2}$ addressed to the encoder, the inverter 39 also delivering the clock signal $\overline{H16}$ addressed to the encoder.

Figure 3:
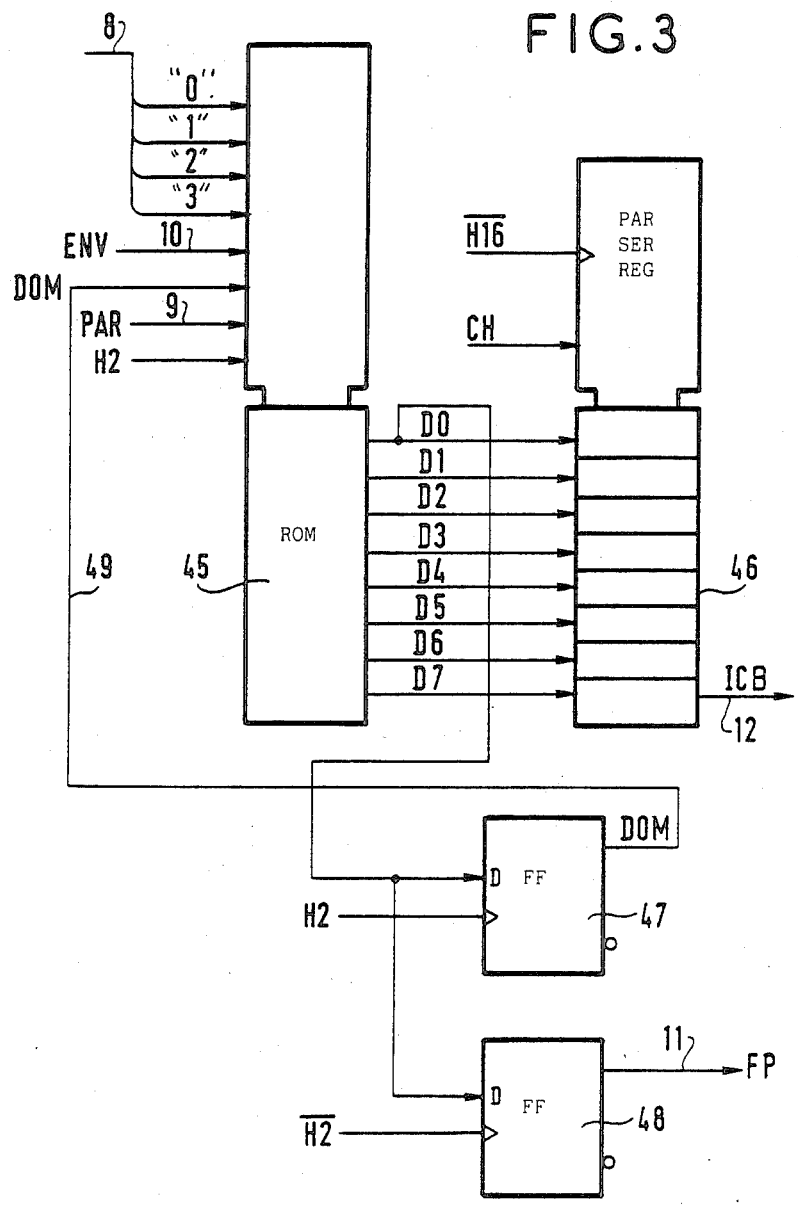
FIG. 3 shows the encoder from FIG. 1.

FIG. 3 shows the encoder 6 from FIG. 1; this encoder comprises a read-only memory 45, a parallel-serial register 46 and two type D flip-flops 47, 48. The input of the read-only memory is connected to the data link 8 which delivers in parallel four bits "0", "1", "2", "3" of a half-byte in NRZ code, to the parity link 9 delivering the parity signal PAR which gives the parity of each half-byte, to the envelope signal ENV of value 1 throughout the duration of a packet, to the clock 5 from which it receives the clock signal H2, and to a line 49 connected to the output of the flip-flop 47 from which it receives a signal DOM, reflecting the state of the last ½ bit of each data half-byte delivered by the read-only memory. The read-only memory 45 has a parallel outputs D0 through D7 connected to the parallel-serial register 46. The output D0 of the read-only memory is also connected to a data input of the flip-flops 47 and 48.

The register 46 is connected to the clock 5 from which it receives the clock signal $\overline{H16}$ and the load signal CH. The serial output of the register 46 is connected by the line 12 to the differential transmitter 7. The flip-flop 47 has its clock input connected to the clock 5 from which it receives the clock signal H2; the flip-flop 48 has its clock input connected to the clock 5 from which it receives the clock signal $\overline{H2}$.

Figure 7:
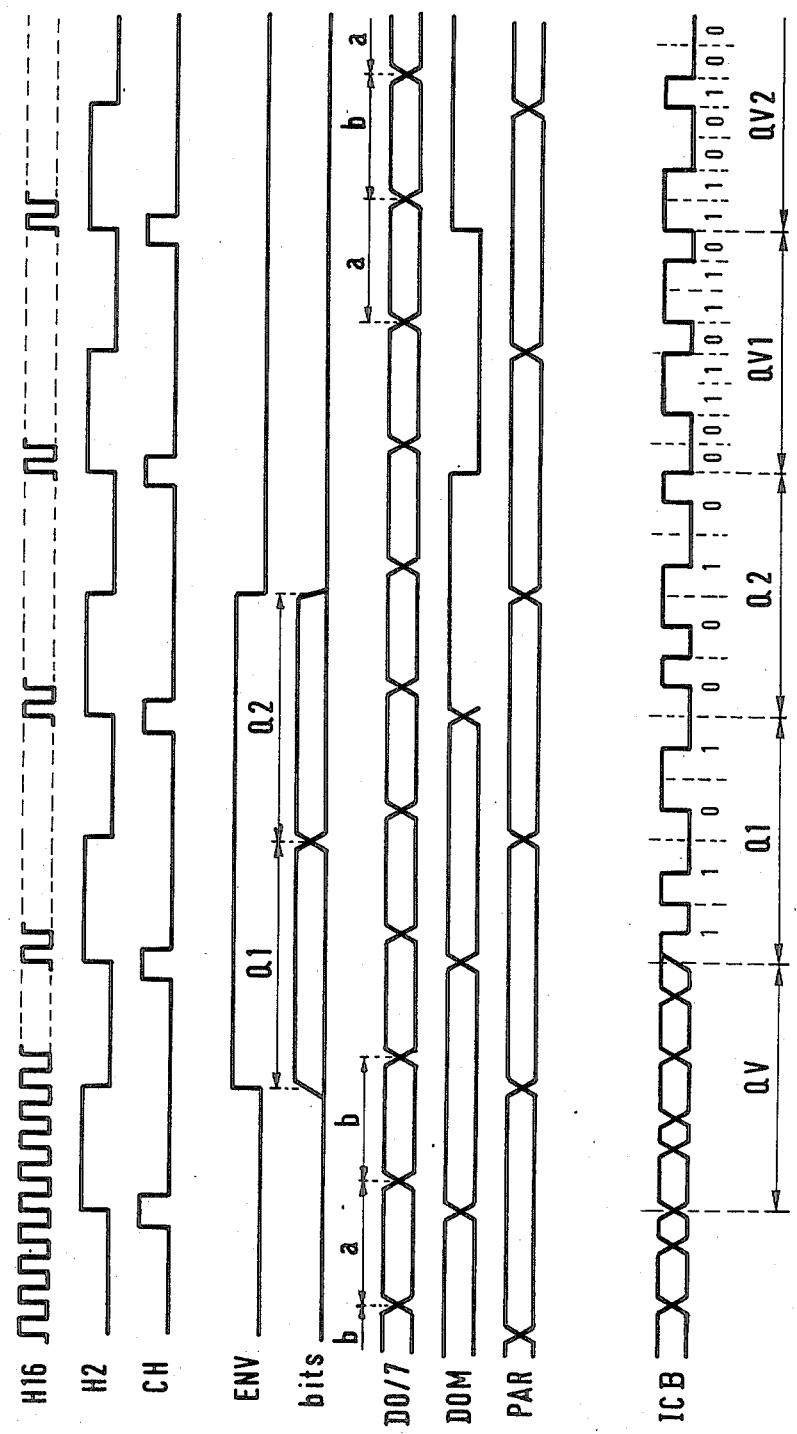
FIG. 7 is a diagram of the signals from the encoder in FIG. 3.

FIG. 7 is a diagram of the signals from the encoder 6. The diagram shows that a data half-byte or an empty half-byte has a duration equal to one period of the clock signal H2 which divides each half-byte interval into two intervals; a first interval when signal H2 has the value 0 and a second interval when the signal H2 has the value 1.

During the first interval (H2=0) the memory 45 encodes:
if the envelope signal ENV has the value 1, the received information half-byte,
if the envelope signal ENV has the value 0, the silence half-byte QV1 (00110110) if the signal DOM has the value 1 or the silence half-byte QV2 (11001001) if the signal DOM has the value 0, and delivers the corresponding bits on outputs D0 through D7.

The eight bits (outputs D0 through D7) which each constitute one half-bit of the Manchester code are loaded in parallel into register 46 where they are shifted at the rate of signal $\overline{H16}$; the bit from output D0 which corresponds to the last ½ bit of the half-byte delivered by the memory is also memorized by the flip-flop 47 which delivers the signal DOM. The eight bits delivered in series constitute the information ICB which is transmitted by the differential transmitter 7 to the receiver 2.

During the second interval (H2=1) the memory 45 decodes the parity signal PAR which gives the parity of the half-byte received and delivers on the output D0 a bit of value 0 if the parity is correct or of value 1 if the parity is incorrect; this bit is memorized by the flip-flop 48 which delivers on the parity error link 11 the parity error signal FP addressed to the circuit which delivers the packets the transmitter.

FIGS. 8 and 9 show the content of the readonly memory 5 of the encoder. In these figures the ADB column is that for the memory addresses in binary; these addresses are given by bits 0, 1, 2, 3, the envelope signal ENV, the signal DOM, the parity signal PAR and the clock signal H2 at the input of the read-only memory; the ADH column gives the address of the words in hexadecimal code and the DM column gives the content of the words in hexadecimal code.

The sets of addresses I, II, III, IV and V correspond:
in the case of set I, to the decoded bits of the half-bytes of a data packet,
in the case of set II, to the decoder output in the absence of any packets to transmit, and thus during the silence between two packets (note that the corresponding addresses concern the empty half-bytes QV1 and QV2; when the signal DOM has the value 1 the memory delivers the empty half-byte QV1 and when the signal DOM has the value 0 the memory delivers the empty half-byte QV2),
in the case of set III, the decoded parity signal PAR when a packet is transmitted and the memory delivers a bit D0 of value 0 indicating that the parity is correct,
in the case of set IV, the decoded parity signal PAR when a packet is transmitted and the memory delivers a bit D0 of value 1 indicating that the parity is incorrect,
in the case of set V, to the decoded parity signal PAR during silences (ENV=0), meaning in the absence of any packets.

It will be noted that in the sets I and II the clock signal H2 has the value 0 and that in the sets III, IV, V this signal has the value 1, which corresponds to the half-intervals of the clock signal H2.

Figure 10:
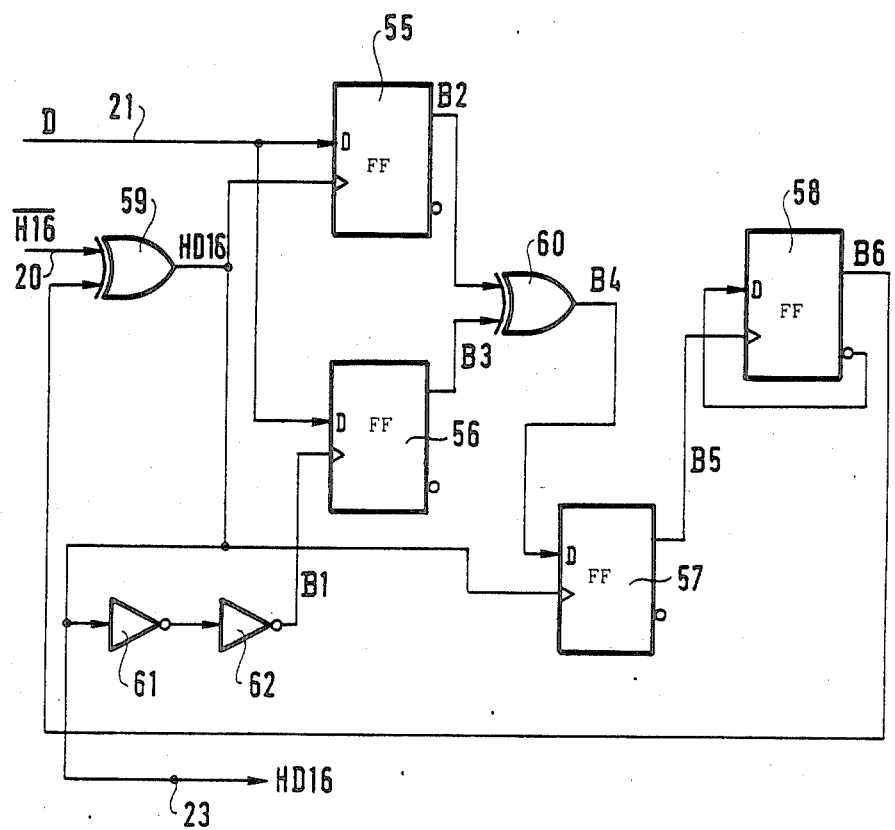
FIG. 10 shows the circuit for choosing the phase of the clock signal from FIG. 1.
Figure 11:
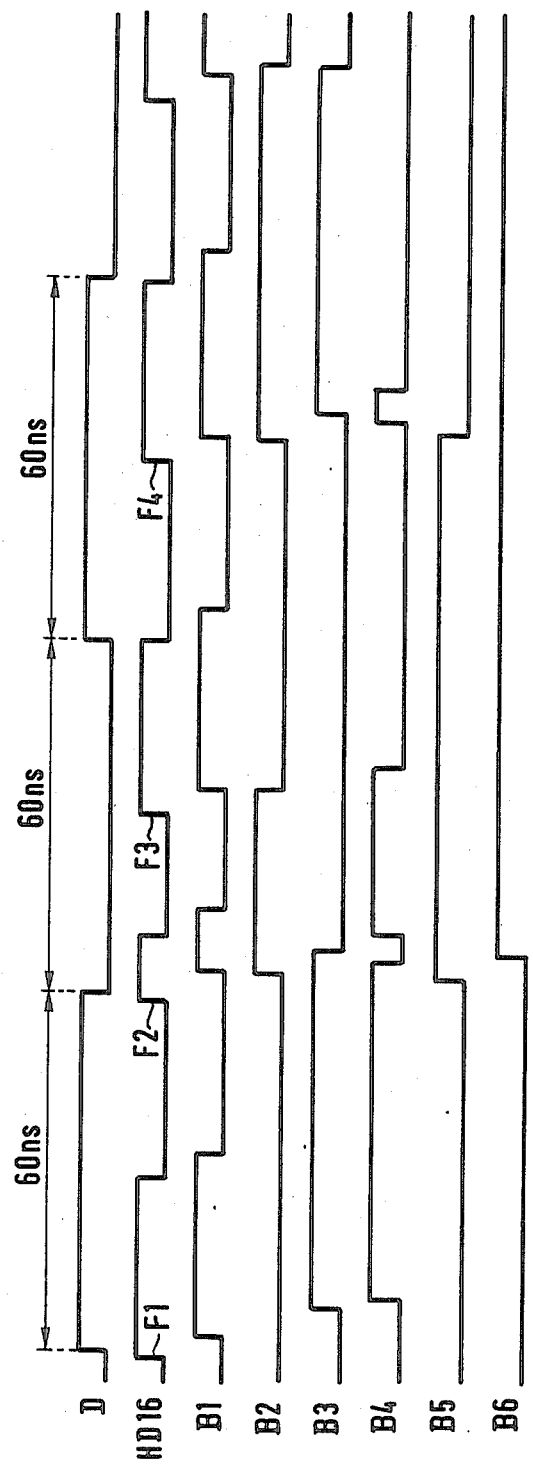
FIG. 11 is a diagram of the signals from the circuit in FIG. 10.

FIG. 10 shows the circuit 16 for choosing the phase of the clock signal from FIG. 1, FIG. 11 being a diagram of the signals at various points in FIG. 10.

The FIG. 10 circuit comprises four type D flip-flops 55, 56, 57, 58, two exclusive-OR gates 59, 60 and two inverters 61, 62 connected in series.

The exclusive-OR gate 59 has an input connected by the clock line 20 to an output of the differential receiver 15 from FIG. 1 and another input connected to the direct output of the flip-flop 58. The output of the exclusive-OR gate 59 delivers a remote clock signal HD16 and is connected to a clock input of the flip-flops 55 and 57, to the inverter 61 and to the output terminal 23 of the choice circuit.

The flip-flop 55 has a data input connected by the data line 21 to another output of the differential receiver 15 from FIG. 1 and a direct output connected to an input of the exclusive-OR gate 60. The flip-flop 56 has a data input connected to the data line 21, a clock input connected to the output of the inverter 62 itself connected to the output of the inverter 61, and a direct output connected to another input of the exclusive-OR gate 60. The flip-flop 57 has a data input connected to the output of the exclusive-OR gate 60 and a direct output connected to the clock input of the flip-flop 58, which has a data input and a complemented output connected to each other.

FIG. 11 is a diagram of signals at various points in FIG. 10. In this FIG. 11 the curve D relates to the data on the data line 21, the curve HD16 represents the remote clock signal applied to the flip-flops 55 and 57, the curve B1 represents the clock signal applied to the flip-flop 56, the curves B2 and B3 represent the signals delivered by the respective flip-flops 55 and 56, the curve B4 represents the output signal of the exclusive-OR gate 60, the curve B5 represents the signal applied to the clock input of the flip-flop 58, and the curve B6 represents the signal delivered by the flip-flop 58 on its direct output.

The circuit for choosing the phase of the clock signal is used in the receiver when the clock signal and the data are carried on different supports from the same transmitter; thus in this case there is strict identity of the transmit timing but there is no imposition of phase synchronization on the signals transmitted on the two supports, meaning the clock line 20 and the data line 21. For this reason the receiver (FIG. 1) has to include the circuit 16 for choosing the phase of the signal shown in FIG. 10, which circuit must function whatever the phase difference between the clock signal and the data signal. The exclusive-OR gate 59 delivers a remote clock signal HD16 which permits sampling of the data signal D by the flip-flops 55 and 56, the clock signal HD16 being applied directly to the flip-flop 55 and via the inverters 61, 62 to the flip-flop 56; because of this, the clock signal B11 is delayed relative to the remote clock signal HD16, this time-delay being introduced by the inverter switching times.

When the signals B2 and B3 both have the value 0 or both the value 1 then the signal B4 has the value 0.

In FIG. 11 the rising edge F1 of the remote clock signal HD16 occurs when the data signal D still has the value 0 and the signal B2 remain at 0, assuming that it had this value. The rising edge in signal B1 occurs when the data signal D has the value 1 and the signal B3 goes to the value 1. The signal B4 goes to the value 1 when the signals B2 and B3 have different values. On the rising edge F2 of the signal HD16 applied to the flip-flop 57 the signal B5 goes to the value 1 and the signal B6 also goes to the value 1 as a result of the signal B5 applied to the flip-flop 58. As the rising edge F2 occurs when the data signal D has the value 1, the signal B2 goes to the value 1 and, the signals B2 and B3 both having the value 1, the signal B4 takes the value 0; signal B1 going to the value 0, with a time-shift relative to the edge F2, the signal B3 goes to the value 0 and the signal B4 takes the value 1. Once the signal B6 has taken the value 1, the exclusive-OR gate 59 delivers a signal HD16 of value 0. The signal B6 having the value 1, the falling edge of the remote clock signal HD16 will result in a rising edge F3 of the remote clock signal HD16 at the output of the exclusive-OR gate 59. This rising edge changes the signal B2 to the value 0 because the data signal D has the value 0; the rising edge of the signal B1 does not change the value of the signal B3 since it already has the value 0; the signals B2 and B3 having the value 0, the signal B4 goes to the value 0. The signal B5 does not change value because the signal B4 still had the value 1 on the rising edge F3 of the remote clock signal HD16 applied to the flip-flop 57.

On the rising edge F4 of the remote clock signal HD16 the signal B5 goes to the value 0 since the signal B4 has the value 0, but this does not change the value of the signal B6. Thus it is seen that when the rising edges F1 and F2 of the remote clock signal HD16 (and thus of the clock signal $\overline{H16}$ from the transmitter) are very close to a transition in the data signal D the circuit for chosing the phase of the clock signal (FIG. 10) inverts the clock signal $\overline{H16}$ that it receives, this invention (edge F3 in FIG. 11) resulting in a change of edge of the remote clock signal HD16 at the output of the exclusive-OR gate 59, this remote clock signal HD16 being delivered by said circuit at its output 23.

Separate transmission of the clock signal is only used where there is little differential jitter, meaning a short distance, that is a few tens of meters, between the transmitter and the receivers; for longer distances transmission over a single link is used.

In the case where the transmitter delivers a clock signal H16 practically in phase with the data signal, the acceptable jitter will be in the order of 8 ns, whichever rising edge is selected, this figure allowing for the switching times of the gates and flip-flops in the circuit of FIG. 10. It is possible to accept a higher degree of jitter, in the order of 23 ns, if the transmitter delivers a clock signal $\overline{H16}$ in phase quadrature with the data signal. In FIG. 11 the remote clock signal HD16 at the output of the exclusiveOR gate is virtually in phase with the data signal D before inversion of the rising edge; this signal HD16 reproduces the signal $\overline{H16}$ delivered by the transmitter.

Figure 12:
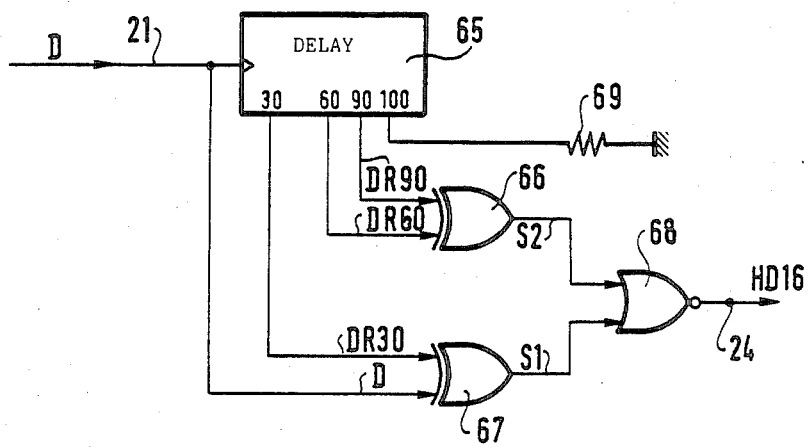
FIG. 12 shows the circuit for reconstituting the clock signal from FIG. 1.
Figure 13:
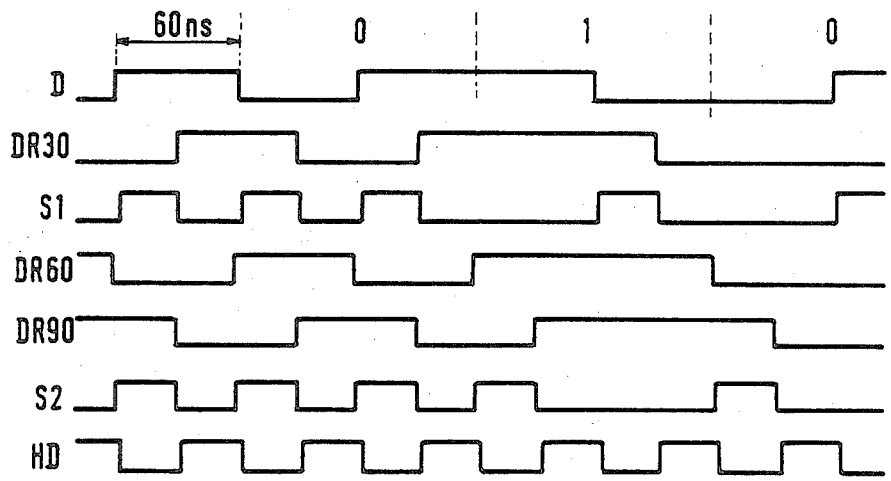
FIG. 13 is a diagram of the signals from the circuit in FIG. 12.

FIG. 12 shows the circuit 17 for reconstituting the clock signal from FIG. 1, FIG. 13 being a diagram of the signals at various points in FIG. 12. The circuit of FIG. 12 comprises a delay line 65, two exclusive-OR gates 66, 67, a NOR gate 68 and a resistor 69. The input of the delay line 65 is connected to the data line 21 (FIG. 1) from which it receives data D and comprises 30, 60, 90 and 100 nanoseconds outputs, the signal received being delayed by steps of 30 ns. The input of the exclusive-OR gate 66 is connected to the 60 ns and 90 ns outputs of the delay line and receives from it the signals DR60 and DR90 which correspond to the data signal D delayed by 60 ns and 90 ns. The input of the exclusive-OR gate 67 is connected to the 30 ns output of the delay line and to the data line 21 and receives the data signal D and a signal DR30 which corresponds to the data signal D delayed by 30 ns.

The input of the NOR gate 68 is connected to the output of the exclusive-OR gates 66, 67 and its output is connected to the output terminal 24 and delivers the remote clock signal HD16. The curves in FIG. 13 relate to the signals at various points in the circuit of FIG. 12; curves S1 and S2 are respectively the output signals of the exclusive-OR gates 66 and 67.

Figure 14:
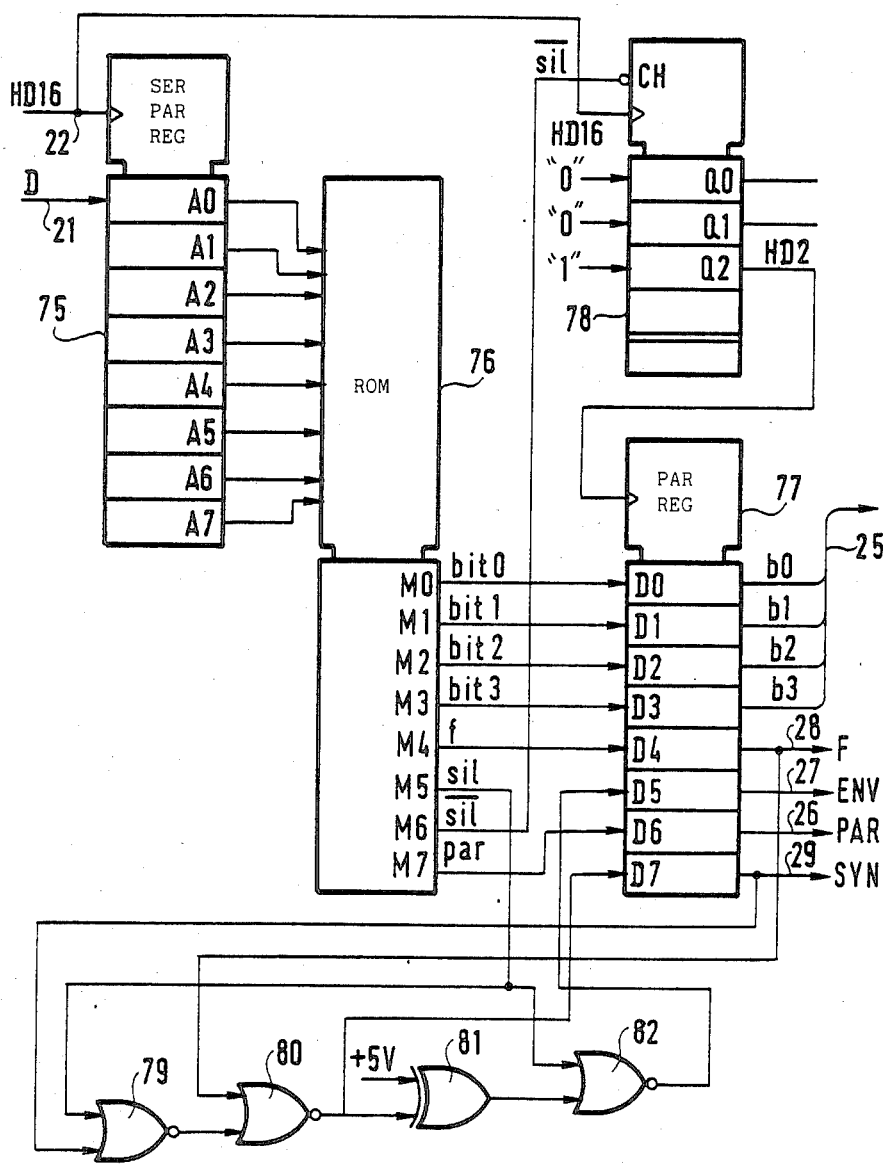
FIG. 14 shows the decoder from FIG. 1.

FIG. 14 shows the decoder 18 from FIG. 1. This decoder comprises a serial-parallel input register 75, a read-only memory 76 with a capacity of 256 words each of eight bits, an output register 77 with parallel inputs and outputs, three NOR gates 79, 80, 82 and an exclusive-OR gate 81.

The input register 75 has a clock input connected to the input terminal 22 (FIG. 1) itself connected either to the terminal 23 of the circuit 16 for choosing the phase of the clock signal or to the output terminal 24 of the circuit 17 for reconstituting the clock signal; the clock input of the register 75 thus receives the remote clock signal HD16 from one of the circuits 16 and 17. The input register 75 has a serial input connected to the data line 21 (FIG. 1) from which it receives the data signal D. The input register 75 has eight parallel outputs A0 through A7 each connected to one input of the read-only memory 76, which has eight parallel outputs M0 through M7; the outputs M0 through M3 deliver bits 0, 1, 2 and 3 in NRZ code, the output M4 delivers an error signal f, the outputs M5 and M6 deliver silence signals sil and $\overline{sil}$, and the output M7 delivers a parity signal par.

The output register 77 has eight parallel inputs $\overline{D0}$ through D7; the inputs D0 through D4 are connected to the outputs M0 through M4 of the read-only memory 76; the input D6 is connected to the output M7 of the read-only memory; the input D5 is connected to the output of the NOR gate 82 from which it receives an envelope signal ENV; the input D7 is connected to the output of the NOR gate 80. The output register 77 delivers on its eight parallel outputs, which correspond to the inputs D0 through D7, bits b0, b1, b2, b3, the error signal F, the envelope signal ENV, the parity signal PAR and a synchronization signal SYN. The NOR gate 79 has an input connected to the output M5 of the read-only memory and another input connected to the output of the output register 77 which delivers the synchronization signal SYN. The NOR gate 80 has an input connected to the output of the output register 77 which delivers the error signal F and another input connected to the output of the NOR gate 79. The exclusive-OR gate 81 has an input connected to the output of the NOR gate 80 and another input connected to a positive potential 30 5 V. The NOR gate 82 has an input connected to the output of the exclusive-NOR gate 81 and another input connected to the output M5 of the read-only memory 76. The counter 78 has a load input CH connected to the output M6 of the read-only memory and a clock input connected to the input terminal 22; the counter has three outputs Q0, Q1, Q2 which respectively deliver the clock signals HD8, HD4, H2 obtained by dividing down by 2, 4 and 8 respectively the remote clock signal HD16; the output Q2 is connected to a clock input of the output register 77.

Figure 15:
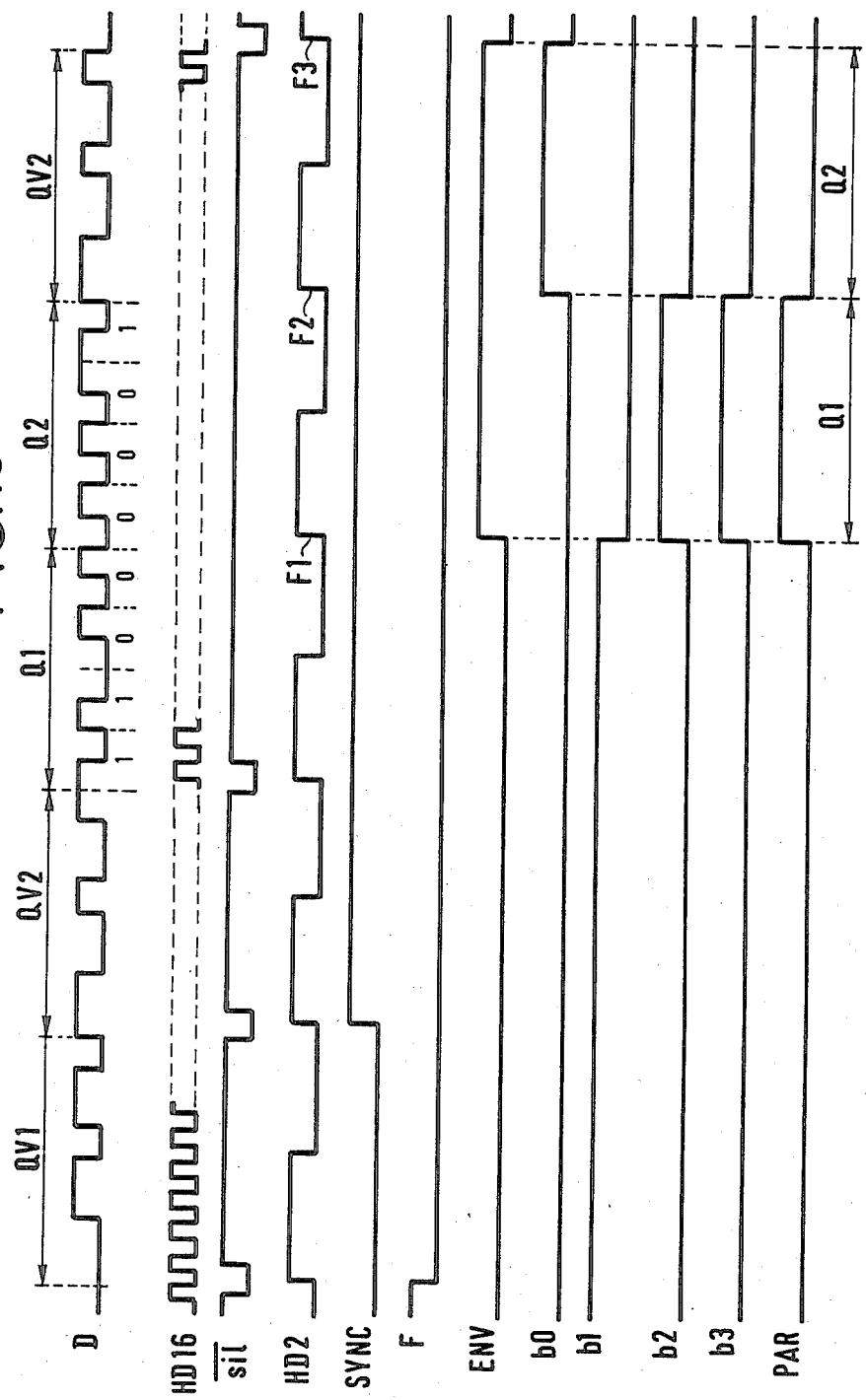
FIG. 15 is a diagram of signals from FIG. 14.

FIG. 15 is a diagram of signals from FIG. 14.

FIG. 16 shows the content of the read-only memory 76 of the decoder; the columns AH and AB are for the read-only memory 76 addresses in hexadecimal (column AH) and in binary (column AB); the columns DB and DH relate to the content of the read-only memory words in binary and in hexadecimal; set I comprises the addresses received without error. It will be noted that the addresses AH correspond to the content DM of the words from sets I and II in FIG. 8, the content of these words being the data delivered by the read-only memory of the transmitter.

In the diagram of FIG. 15 it has been assumed that the decoder delivers an error signal F and that this signal disappears, going from the value 1 to the value 0. The first empty half-byte QV1 being delivered by the read-only memory 76, the silence signal sil goes to the value 1 at the end of the empty half-byte and the synchronization signal SYN takes the value 1 on the rising edge of the clock signal HD2.

On receiving the first data half-byte Q1 the read-only memory delivers on its outputs M0 through M7 the signal bits corresponding to the word addressed by the first half-byte and the output register 77 delivers on the positive edge F1 of the clock signal HD2 (FIG. 15) the signal ENV, bits b0, b1, b2, b3 and the parity signal PAR; the error signal F remains at the value 0 since the first half-byte received is correct. On receiving the second data half-byte Q2 the output register 77 delivers on the positive edge F2 of the clock signal HD2 the signals corresponding to the read-only memory word addressed by this second half-byte. If as shown by way of example in FIG. 15 the second half-byte is followed by an empty half-byte, on the positive edge F3 in clock signal HD2 the envelope signal takes the value 0, as do bits b0, b1, b2, b3; the parity signal PAR remains at 0. The data half-bytes received being correct, the synchronization signal SYN remains at the value 1; if there were an error, the error signal F delivered by the output register 77 operating on the NOR gate 80 (FIG. 14), the synchronization signal at the output of said NOR gate would take the value 0, as would the synchronization signal SYN at the output of the output register 77.

Figure 19:
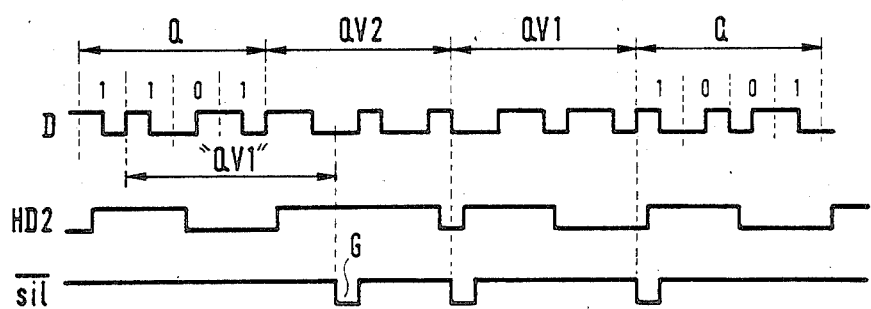
FIG. 19 is a diagram of signals from the decoder of FIG. 14 in the case of imitation of an empty half-byte.

It has already been stated that imitation of the empty half-bytes will not prejudice correct functioning of the receiver; this will now be explained with the help of FIG. 19 which shows the data signal D, the clock signal HD2 and the silence signal sil delivered by the output M6 of the read-only memory 76 of the decoder from FIG. 14, in the case of imitation of an empty half-byte of the first type, this imitation being referenced "QV1" in FIG. 19. The silence signal sil still has the value 1 when the data D received relates to data half-bytes; it takes the value 0 at the end of each empty half-byte during one period of the remote clock signal HD16 and then returns to the value 1. In FIG. 19 the silence signal sil thus normally changes to the value 0 at the end of the empty half-bytes QV2 and QV1. In the case represented of imitation of an empty half-byte, the silence signal sil also goes to the value 0 at G, that is to say at the end of the imitated empty half-byte "QV1", whereas it should retain the value 1. The silence signal sil being applied to the load input of the counter 78, the latter is forced to the value 1 each time that the silence signal sil goes to the value 0, which in normal operation permits good synchronization of the clock signal HD2 with the data signal D. When the silence signal sil goes to the value 0 at G the counter 78 is forced to 1 and the clock signal HD2 remains at the value 1; it does not return to the value 0 for four periods of the remote clock signal HD16, then returning normally to the value 1 on the next period. Thus it is seen that imitation of an empty half-byte leads to disturbance in the duty cycle of the clock signal HD2 for one period, but that there is no disruption of the positive edges of this clock signal; as the output register 77 is loaded on the positive edges of the clock signal HD2, its operation is not disturbed by any imitation of an empty half-byte. Although FIG. 19 shows imitation of an empty half-byte QV1, imitation of an empty half-byte QV2 would likewise result in a disturbance of the silence siganl sil and thus of the clock signal HD2, these disturbances having no effect on the functioning of the output register 77.

Figure 17:
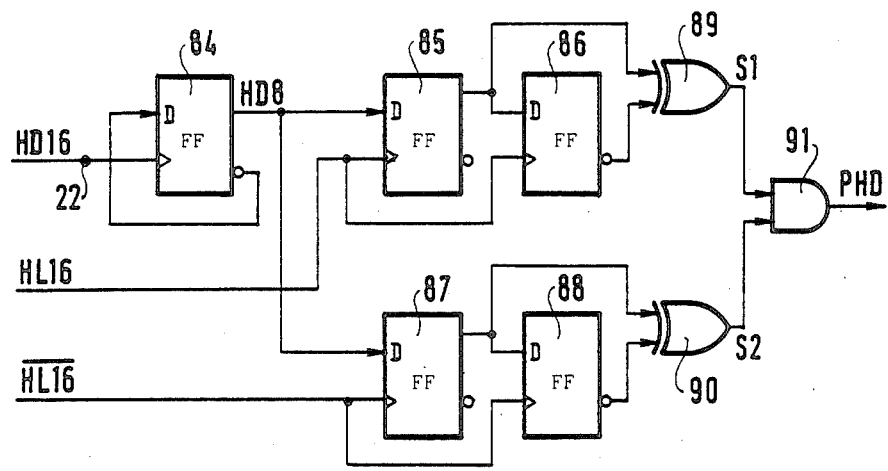
FIG. 17 shows the circuit for detecting loss of the signal from FIG. 1.

FIG. 17 shows the circuit 19 for detecting loss of the clock signal from FIG. 1. This circuit comprises five type D flip-flops 84, 85, 86, 87, 88, two exclusive-OR gates 89, 90 and an AND gate 91.

The flip-flop 84 has a clock input connected to the input 22 of the decoder 18 and receives the remote clock signal HD16; its data input is connected to its complemented output and its direct output delivers a clock signal HD8 and is connected to the data input of the flip-flop 85; thus the flip-flop 84 operates as a divider by two. The flip-flop 85 receives a local clock signal HL16 on a clock input. The flip-flop 87 has a data input connected to the direct output of flip-flop 84 and receives from it the clock signal HD8 and a clock input which receives a complemented local clock signal $\overline{\text{HL16}}$. The local clock is part of the receiver 2 from FIG. 1, in which it is not shown; it delivers local clock signals HL16 and $\overline{\text{HL16}}$, each of which is the complement of the other, with a frequency of 16 MHz, the same frequency as the transmitter clock 5. The flip-flop 86 has a data input connected to the direct output of the flip-flop 85 and a clock input which receives the local clock signal $\overline{\text{HL16}}$. The exclusive-OR gate 89 has an input connected to the direct output of the flip-flop 85 and an input connected to the complemented output of the flip-flop 86. The flip-flop 88 has a data input connected to the direct output of the flip-flop 87 and a clock input which receives the complemented local clock signal HL16. The exclusive-OR gate 90 has an input connected to the direct output of the flip-flop 87 and an input connected to the complemented output of the flip-flop 88. The AND gate 91 has an input connected to the output of the exclusive-OR gate 89 and an input connected to the output of the exclusive-OR gate 90; if output delivers a signal PHD indicating loss of clock signal.

Figure 18:
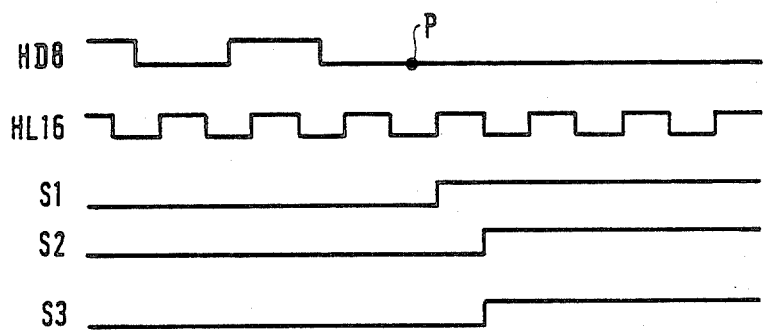
FIG. 18 is a diagram of signals from the circuit of FIG. 17.

FIG. 18 is a diagram of signals from FIG. 17. The flip-flops 85 and 86 memorize one period of the clock signal HD8 and are driven by the positive edges of the local clock signal HL16. The flip-flops 87 and 88 memorize one period of the clock signal HD8 and are driven by the positive edges of the complemented local clock signal $\overline{HL16}$, which correspond to the negative edges of the local clock signal HL16. When the clock signal HD8 is present the signals S1 and S2 at the outputs of the exclusive-OR gates 89, 90 have the value 0. Following loss of the clock signal HD8, point P in FIG. 18, the signal S1 takes the value 1 on the positive edge of the local clock signal HL16, the signal S2 takes the value 1 on the positive edge of the complemented clock signal $\overline{HL16}$, and the AND gate 91 delivers the signal PHD indicating loss of clock signal.

There is claimed:

1. Method of encoding silences separating packets in a packet transmission system in which each packet comprises half-bytes of data delivered by a Manchester code transmitter and addressed to a receiver, in which method the transmitter delivers, during the silences and alternately, two types of empty half-byte which are mirror images of each other and each comprise four bits of alternating values, and only the third and fourth bits of each empty half-byte comprise a median transition according to the Manchester code, an empty half-byte of a first type having a first bit of level 0, a second bit of level 1, a third bit of value 0 and a fourth bit of value 1, an empty half byte of a second type having a first bit of level 1, a second bit of level 0, a third bit of value 1 and a fourth bit of value 0.

2. Method of encoding silences in accordance with claim 1, wherein the transmitter delivers, after a first half-byte of data of a packet, an empty half-byte giving a transition with said last data half-byte, said empty half-byte being of the first type when the last data half-byte ends with a bit of value 0 and of the second type when the last data half-byte ends with a bit of value 1.

3. Device for transmitting packets in an asynchronous time-division network, each silence separating two packets being encoded according to a method of encoding silences separating packets in a packet transmission system in which each packet comprises half-bytes of data delivered by a Manchester code transmitter and addressed to a receiver, in which method the transmitter delivers, during the silences and alternately, two types of empty half-byte which are mirror images of each other and each comprise four bits of alternating values, and only the third and fourth bits of each empty half-byte comprise a median transition according to the Manchester code, an empty half-byte of a first type having a first bit of level 0, a second bit of level 1, a third bit of value 0 and a fourth bit of value 1, an empty half-byte of a second type having a first bit of level 1, a second bit of level 0, a third bit of value 1 and a fourth bit of value 0 and wherein the transmitter delivers, after a first half-byte of data of a packet, an empty half-byte giving a transition with said last data half-byte, said empty half-byte being of the first type when the last data half-byte ends with a bit of value 0 and of the second type when the last data half-byte ends with a bit of value 1, said device comprising a transmitter and a receiver connected by a data link carrying data half-bytes in Manchester code of which each bit consists of two half-bits of different value and empty half-bytes, wherein the transmitter comprises a clock, an encoder and a differential transmitter circuit with its output connected to the data link, the clock delivering a first clock signal, a second clock signal obtained by dividing down by eight the first clock signal, and a load signal at the beginning of each first half-period of the second clock signal, the encoder comprises a read-only memory, a register of the parallel-serial type driven by the first clock signal and receiving on a loading input the load signal, said register having a serial output connected to the differential transmitter circuit, a bistable driven by the second clock signal, the read-only memory has its input connected to an information link delivering in parallel four bits in NRZ code constituting an information half-byte, said four bits all having the value 0 during the silences, to a parity link delivering a parity bit for each information half-byte, to an envelope link delivering a signal of value 1 throughout the duration of a packet, to the clock from which it receives the second clock signal, and to the output of the bistable, the read-only memory has eight parallel outputs connected to the parallel inputs of the register, the first output of the read-only memory being also connected to an input of the bistable, the read-only memory delivering a data half-byte in Manchester code for each information half-byte received and empty half-bytes during silences, the first output of the read-only memory delivering a bit whose value corresponds to the level of the last half-bit of the half-byte delivered, the bistable memorizes said bit delivered by said first output of the read-only memory and delivers a signal reflecting the state of the last half-bit of the half-byte, the four bits of an information half-byte, the parity bit, the envelope signal, the second clock signal and the signal reflecting the state of the last half-bit constitute a read-only memory address, the read-only memory delivers during a first half-period of the second clock signal eight bits corresponding to a data half-byte when the envelope signal has the value 1, to a first empty half-byte when the envelope signal has the value 0 and the signal reflecting the state of the last half-bit has the value 1, and a second empty half-byte when the envelope signal has the value 0 and the signal reflecting the state of the last half-bit has the value 0.

4. Transmission device according to claim 3, wherein the encoder further comprises a second bistable driven by the complemented second clock signal and having a data input connected to the first output of the read-only memory, and the read-only memory delivers eight bits during a second half-byte of the second clock signal, the first output of the read-only memory delivering to the second bistable a bit of value 1 when the parity of the information half-byte received is incorrect, the second bistable memorizing said bit and delivering a parity error signal of value 1 in response to a parity error.

5. Transmission device according to claim 3, wherein the transmitter and the receiver are also connected by a clock link connected to an output of the differential transmitter circuit of which an input is connected to the clock to receive from it the first clock signal.

6. Transmission device according to claim 3, wherein the receiver comprises a differential receiver connected by the data link to the differential transmittter circuit, a circuit for reconstituting the clock signal and a decoder, the differential receiver having its output connected by a data line to the clock signal reconstituting circuit and to the decoder, the decoder having an input connected to an output of the clock signal reconstituting circuit which delivers a first remote clock signal, the decoder having its output connected to a data output link, to a parity output link, to an envelope output link, to an error output link and to a synchronization output link.

7. Transmission device according to claim 5, wherein the receiver comprises a differential receiver connected to the differential transmitter circuit by the clock link and by the data link, a circuit for choosing the phase of the clock signal and a decoder, the differential receiver having an output connected to the circuit for choosing the phase of the clock signal by a clock line and another output connected by a data line to the circuit for choosing the phase of the clock signal and to the decoder, the decoder having an input connected to an output of the circuit for choosing the phase of the clock signal and receiving from it a first remote clock signal, the decoder having its output connected to a data output link, to a parity output link, to an envelope output link, to an error output link and to a synchronization output link.

8. Transmission device according to claim 5, wherein the decoder comprises a serial-parallel type input register, a read-only memory, a parallel-parallel type output register, a counter, first, second and third NOR gates and an exclusive-OR gate, the input register and the counter each have a clock input connected to the input of the decoder, the input register has a data input connected to the data line and eight parallel outputs connected to eight parallel inputs of the read-only memory for addressing said read-only memory, the read-only memory has eight parallel outputs, first, second, third and fourth outputs each delivering one information bit of an information half-byte and being connected to first, second, third and fourth parallel inputs of the output register, a fifth output delivering an error signal connected to a fifth input of the output register, a sixth output delivering a silence signal connected to an input of each of the first and third NOR gates a seventh output delivering a complemented silence signal connected to a loading input of the counter, and an eighth output delivering a parity signal and connected to a seventh input of the output register, the output register has eight outputs each corresponding to one input of said output register, the first, second, third and fourth outputs of the output register delivering the four bits of the information half-byte and being connected to the data output link, the fifth output being connected to the error output link, the sixth output being connected to the envelope output link, the seventh output being connected to the parity output link, the eighth output being connected to the synchronization link, the first NOR gate has another input connected to the synchronization output link and an output connected to an input of the second NOR gate another input of which is connected to the error output link, the second NOR gate having an output connected to an input of the exclusive-OR gate and to the eighth input of the output register, the exclusive-OR gate has another input held at a positive potential and an output connected to another input of the third NOR gate of which an output is connected to the sixth input of the output register, and the counter has its output connected to a clock input of the output register, said counter delivering a second remote clock signal obtained by dividing by eight the first remote clock signal received by the counter.

9. Transmission device according to claim 6, wherein the decoder comprises a serial-parallel type input register, a read-only memory, a parallel-parallel type output register, a counter, first, second and third NOR gates and an exclusive-OR gate, the input register and the counter each have a clock input connected to the input of the decoder, the input register has a data input connected to the data line and eight parallel outputs connected to eight parallel inputs of the read-only memory for addressing said read-only memory, the read-only memory has eight parallel outputs, first, second, third and fourth outputs each delivering one information bit of an information half-byte and being connected to first, second, third and fourth parallel inputs of the output register, a fifth output delivering an error signal connected to a fifth input of the output register, a sixth output delivering a silence signal connected to an input of each of the first and third NOR gates a seventh output delivering a complemented silence signal connected to a loading input of the counter, and an eighth output delivering a parity signal and connected to a seventh input of the output register, the output register has eight outputs each corresponding to one input of said output register, the first, second, third and fourth outputs of the output register delivering the four bits of the information half-byte and being connected to the data output link, the fifth output being connected to the error output link, the sixth output being connected to the envelope output link, the seventh output being connected to the parity output link, the eighth output being connected to the synchronization link, the first NOR gate has another input connected to the synchronization output link and an output connected to an input of the second NOR gate another input of which is connected to the error output link, the second NOR gate having an output connected to an input of the exclusive-OR gate and to the eighth input of the output register, the exclusive-OR gate has another input held at a positive potential and an output connected to another input of the third NOR gate of which an output is connected to the sixth input of the output register, and the counter has its output connected to a clock input of the output register, said counter delivering a second remote clock signal obtained by dividing by eight the first remote clock signal received by the counter.

10. Transmission device according to claim 7, wherein the circuit for choosing the phase of the clock signal comprises first, second, third and fourth bistables, first and second exclusive-OR gates, first and second inverters connected in series, the first exclusive-OR gate has an input connected to the differential receiver by the clock line and receives the first clock signal from the transmitter, another input connected to a direct output of the fourth bistable and an output connected to a clock input of the first and third bistables, to the input of the first inverter and to the output of the circuit for choosing the phase of the clock signal, said first exclusive-OR gate delivering a first remote clock signal, the first and second bistables each have a data input connected to the differential receiver by the data line, the second inverter has its output connected to a clock input of the second bistable, the second exclusive-OR gate has one input connected to a direct output of the first bistable, another input connected to a direct output of the second bistable and an output connected to a data input of the third bistable, and the fourth bistable has a clock input connected to a direct output of the third bistable and a data input and a complemented output connected to each other.

* * * * *